United States Patent [19]
Teshima et al.

[11] Patent Number: 5,593,080
[45] Date of Patent: Jan. 14, 1997

[54] MASK FOR PRINTING SOLDER PASTE

[75] Inventors: Yasuhiro Teshima; Tetsuo Kurokawa, both of Kawasaki, Japan

[73] Assignee: Fujitsu Limited, Kawasaki, Japan

[21] Appl. No.: 489,616

[22] Filed: Jun. 12, 1995

Related U.S. Application Data

[63] Continuation of Ser. No. 198,391, Feb. 18, 1994, abandoned, which is a continuation of Ser. No. 965,702, Oct. 23, 1992, abandoned.

[30] Foreign Application Priority Data

Oct. 29, 1991 [JP] Japan ................................. 3-281794
Jun. 4, 1992 [JP] Japan ................................. 4-143084

[51] Int. Cl.⁶ ............................ B23K 37/06; H05K 3/34
[52] U.S. Cl. ........................ 228/39; 29/840; 101/127
[58] Field of Search ...................... 29/839–843, 852; 101/126, 127, 129; 118/406, 504; 228/39, 56.3, 248.1, 264, 180.1; 427/96, 259, 265; 430/5

[56] References Cited

U.S. PATENT DOCUMENTS

| 2,964,007 | 12/1960 | Buffington | 228/39 X |
|---|---|---|---|
| 3,516,155 | 6/1970 | Smith | 29/839 |
| 4,311,267 | 1/1982 | Lim | 228/248.1 X |
| 4,323,593 | 4/1982 | Tsunashima | 29/852 X |
| 4,626,309 | 12/1986 | Mullen, III et al. | 29/830 X |
| 4,694,138 | 9/1987 | Oodaira et al. | 427/229 X |
| 4,739,919 | 4/1988 | Van Den Brekel et al. | 228/39 X |
| 4,774,760 | 10/1988 | Seaman et al. | 228/56.3 X |
| 4,872,261 | 10/1989 | Sanyal et al. | 101/127 X |
| 4,953,460 | 9/1990 | Wojcik | 29/840 X |
| 5,129,573 | 6/1992 | Duffey | 228/248.1 X |

FOREIGN PATENT DOCUMENTS 2238693  9/1990  Japan ....................... 228/39

OTHER PUBLICATIONS

"Solder Mask" IBM Technical Disclosure Bulletin, vol. 9, No. 3, Aug. 1966, pp. 234–235.

*Primary Examiner*—Peter Vo
*Attorney, Agent, or Firm*—Armstrong, Westerman, Hattori, McLeland & Naughton

[57] ABSTRACT

A mask for printing solder paste includes a mask plate, and first mask holes which are formed in the mask plate and have a first size, and second mask holes which are formed in the mask plate and have a second size smaller than the first size. The mask plate has a first region having the first mask holes, and a second region having the second mask holes. The mask plate has a first thickness in the first region, and a second thickness in the second region. The second thickness is smaller than the first thickness.

12 Claims, 11 Drawing Sheets

MASK FOR PRINTING SOLDER PASTE

This application is a continuation of application Ser. No. 08/198,391 filed Feb. 18, 1994, now abandoned, which was a continuation of application Ser. No. 07/965,702, filed Oct. 23, 1992, now abandoned.

BACKGROUND OF THE INVENTION

1. Field of the Invention

The present invention generally relates to masks for printing solder paste and methods of soldering electronic parts using the mask, and more particularly to a mask which is used to print a solder paste on a printed wiring board and a method of soldering electronic parts using such a mask.

2. Description of the Related Art

Presently, solder is used as the bonding material when bonding the electronic part to the printed wiring board because of the many advantageous features of the solder. As methods of supplying the solder to the printed wiring board, there is a first method which employs screen (or stencil) printing of the solder paste, a second method which generates a solder film by plating on a foot print (pad), and a third method which uses chemical reaction.

The first method is inexpensive and easy, but it is difficult to apply the screen printing to fine pads. On the other hand, the second method involves a complex process and is expensive, and further, it takes time to obtain the desired film thickness. Moreover, the film thickness is considerably inconsistent on a large board, and the plated film thickness is normally on the order of 10 μm which is small. As for the third method, special equipment (technique) and materials are required, and involves a complex process and is expensive as in the case of the second method.

Accordingly, the second and third methods are, in most cases, applied to fine pads, and the screen printing or the like is made independently with respect to normal pads. As a result, the method of supplying the solder requires two independent processes which are troublesome to carry out, and there is a demand to improve the first method.

FIG. 1 is a diagram for explaining an example of a surface mounting of electronic parts on a board. In FIG. 1, (A) shows a plan view and (B) shows a cross section along a line A—A in (A). In FIG. 1, there are shown a circuit board (printed wiring board) 1, fine pads 2, normal pads 3, a fine pitch part (semiconductor part) 5 such as a quad flat package (QFP), and normal pitch parts (circuit parts) 6 such as resistors and capacitors.

Because of the reduced size and narrow pitches of the recent electronic parts, a solder film in the form of a thin paste is formed on the fine pads 2 and the normal pads 3 on the circuit board 1. Then, the fine pitch part 5 and the normal pitch parts (chip parts) 6 are mounted by reflow soldering. Hence, it is possible to realize a high density surface mounting.

For example, leads (not shown) of the QFP 5 have a width of 150 μm and are arranged at a pitch of approximately 0.3 mm. The rectangular (box-shaped) fine pads 2 having a length of 2 mm and a width of 150 μm are also arranged at a pitch of 0.3 mm so as to surround the QFP 5 located at the center. On the other hand, the normal pads 3 have a square shape having a side of approximately 1.5 mm and are arranged at a sufficiently large pitch.

FIG. 2 is a diagram for explaining a conventional screen printing. In FIG. 2, (A) shows a plan view, and (B) shows a cross section along a line A—A in (A). In FIG. 2, those parts which are the same as those corresponding parts in FIG. 1 are designated by the same reference numbers. In FIG. 2, there are additionally shown a squeegee 7, a solder paste 8, a metal mask (metal screen) 10, fine mask holes 12, and normal mask holes 13. The rectangular fine pads 2 having a length L=2 mm and a width W=150 μm are arranged at a pitch P=0.3 mm on the circuit board 1, and the normal pads 3 which are sufficiently large compared to the fine pads 2 are arranged on the periphery of the fine pads 2.

The metal mask 10 has a plate thickness t of approximately 150 to 200 μm. The fine mask holes 12 having a shape approximately the same as that of the fine pads 2 are formed in the metal mask 10 at positions corresponding to the fine pads 2, and the normal mask holes 13 having a shape approximately the same as that of the normal pads 3 are formed in the metal mask 10 at positions corresponding to the normal pads 3. The aperture size (l, w) of the mask holes 12 and 13 is normally selected to a shape which is reduced by several tens of μm from the foot print size (L, W).

The metal mask 10 is aligned to and placed on the circuit board 1, and the solder paste 8 is coated on the entire surface of the metal mask 10. Then, the squeegee 7 is moved while pushing against the metal mask 10 so as to fill the solder paste 8 into the mask holes 12 and 13, and the metal mask 10 is thereafter removed. As a result, a solder paste film having the same thickness as the plate thickness t of the metal mask 10 is formed above the pads 2 and 3, and the amount of supplied solder is determined by the plate thickness t of the metal mask 10 and the mask aperture area (l×w).

When making the screen printing with the solder paste using the aperture shape of the metal mask 10 described above, it is regarded that the optimum film thickness of the normal pad 3 is approximately 150 to 200 μm and the optimum film thickness of the fine pad 2 is approximately 100 μm.

However, if the conventional metal mask 10 is used, the fine pads 2 which are actually formed also have a film thickness of approximately 150 to 200 μm. For this reason, there is a problem in that the thick fine pads 2 may generate a solder ball or cause a bridge which would cause a short-circuit. In other words, the conventional method supplies too much solder.

Accordingly, the plate thickness t of the entire metal mask 10 has conventionally been made small. However, when the plate thickness t is made small, it is possible to make the film thickness of the fine pad 2 an optimum value but the film thickness of the normal pad 3 becomes insufficient.

In addition, the aperture width w of the fine mask hole 12 has conventionally been reduced further. But as described above, the plate thickness t of the metal mask 10 is 150 to 200 μm and the aperture width w of the fine mask hole 12 is 150 μm or less. For this reason, the aspect ratio (w/t) at the cross section of the fine mask hole 2 is 1 or less.

In general, if the aspect ratio becomes 1 or less, it is known that the aperture size at the middle part of the side wall of the fine mask hole 2 becomes smaller than the aperture size at both the front and back surfaces of the metal mask 10 when carrying out the etching process with respect to the metal mask 10. For this reason, the solder film formed on the fine pad 2 becomes narrower than the desired value if such a metal mask 10 is used, and there is a problem in that the reliability of the reflow soldering becomes poor.

In addition, if the aspect ratio becomes 1 or less, the friction between the solder paste and the sidewall of the fine mask hole 12 becomes large when removing the metal mask 10 after the screen printing. As a result, the solder paste does not escape from the fine mask hole 12 in a satisfactory manner, and there are problems in that the printing becomes thin, the supply of the solder paste is insufficient and the like. Furthermore, there is also a problem in that precision forming the fine mask holes 12 having the aspect ratio of 1 or less is extremely difficult.

If only the improvement of the aspect ratio is considered, it is possible to make the aspect ratio greater than 1 by making the fine mask width w greater than the fine pad width W. But in this case, an excess amount of solder paste would be supplied, and the possibility of forming a solder ball or bridge would become high.

Conventionally, the fine mask holes 12 have the rectangular shape to match the rectangular shape of the fine pads 2. Hence, there has been a problem in that the printing characteristic of the solder paste greatly differs depending on the moving direction of the squeegee 7. Consequently, controlling the supply of solder paste, such as changing the mask aperture shape (printed board) depending on the moving direction of the squeegee 7, is extremely delicate and difficult.

FIG. 3 is a flow chart for explaining the conventional soldering method. In a step S1, the above described metal mask 10 is used to do the screen printing of the solder paste on each pad of the circuit board. In a step S2, the normal pitch parts and the fine pitch parts are mounted on the pads in one process, and a reflow soldering is done in a step S3. That is, a process of preheating to a temperature of 120° to 160° C. for 20 to 30 seconds is performed in a step S24, and a main process of heating to a peak temperature of 230° C. is performed in a step S25.

However, when the screen printing is made by the conventional metal mask 10, an excess amount of the solder paste is supplied on the fine pads, and the flux component within the solder paste is melted by the preheating process prior to the main heating process. As a result, the excess solder particles are pushed to the outside by the weight of the fine pitch parts, and the solder ball and bridge phenomena frequently occur.

Therefore, it has conventionally been difficult to supply an appropriate amount of the solder paste on both the fine pads and the normal pads of the circuit board in one screen printing process using the conventional mask.

In addition, the solder ball and bridge phenomena frequently occur when employing the conventional soldering method to form the fine pads in particular.

SUMMARY OF THE INVENTION

Accordingly, it is a general object of the present invention to provide a novel and useful mask for printing solder paste and a method of soldering electronic parts using the mask, in which the problems described above are eliminated.

Another and more specific object of the present invention is to provide a mask for printing solder paste and a method of soldering electronic parts using the mask, which soldering can be performed with high reliability and in which the bridge phenomena can be prevented.

The above objects of the present invention are achieved by a mask for printing solder paste comprising: a mask plate; and first mask holes which are formed in the mask plate and have a first size, and second mask holes which are formed in the mask plate and have a second size smaller than the first size, the mask plate having a first region having the first mask holes, and a second region having the second mask holes, the mask plate having a first thickness in the first region, and a second thickness in the second region, and the second thickness being less than the first thickness.

The above objects of the present invention are also achieved by a mask for printing solder paste comprising: a mask plate having a uniform thickness; and first mask holes which are formed in the mask plate and which have a first size, and second mask holes which are formed in the mask plate and which have a second size smaller than the first size, the second mask holes having an approximately circular shape or a shape having functions identical to functions of the circular shape.

The above objects of the present invention are also achieved by a method of soldering electronic parts comprising the steps of: (a) positioning a mask on a printed wiring board, the mask comprising a mask plate, and first mask holes which are formed in the mask plate and have a first size, and second mask holes which are formed in the mask plate and have a second size smaller than the first size, the mask plate having a first region having the first mask holes, and a second region having the second mask holes, the mask plate having a first thickness in the first region, and a second thickness in the second region, and the second thickness being less than the first thickness; (b) coating a solder paste on the mask so that the first and second mask holes are filled with the solder paste and are in contact with pads on the printed wiring board; (c) mounting electronic parts on the printed wiring board; and (d) heating the solder paste.

The above objects of the present invention are also achieved by a method of soldering electronic parts comprising the steps of: (a) positioning a mask on a printed wiring board, the mask comprising a mask plate having a uniform thickness, and first mask holes which are formed in the mask plate and which have a first size, and second mask holes which are formed in the mask plate and which have a second size smaller than the first size, the second mask holes having an approximately circular shape or a shape having functions identical to functions of the circular shape; (b) coating a solder paste on the mask so that the first and second mask holes are filled with the solder paste and are in contact with pads on the printed wiring board; (c) mounting electronic parts on the printed wiring board; and (d) heating the solder paste.

Other objects and further features of the present invention will be apparent from the following detailed description when read in conjunction with the accompanying drawings.

DESCRIPTION OF THE PREFERRED EMBODIMENTS

A description will be given of the embodiments of the present invention, by referring to FIGS.4 through 11. In FIGS.4 through 11, the same parts or the corresponding parts are designated by the same reference numbers.

Figure 1A:
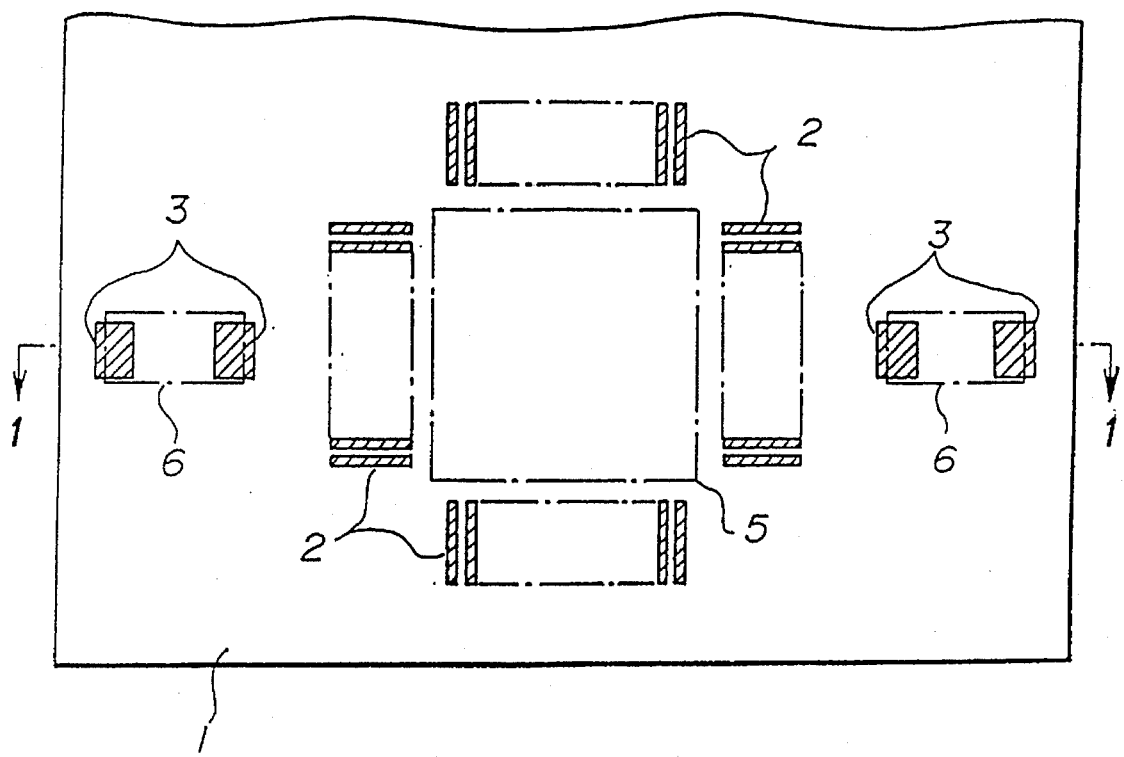
FIGS.1(A)–(B) are top and cross-sectional views, respectively, for explaining an example of a surface mounting of electronic parts on a board.
Figure 1B:
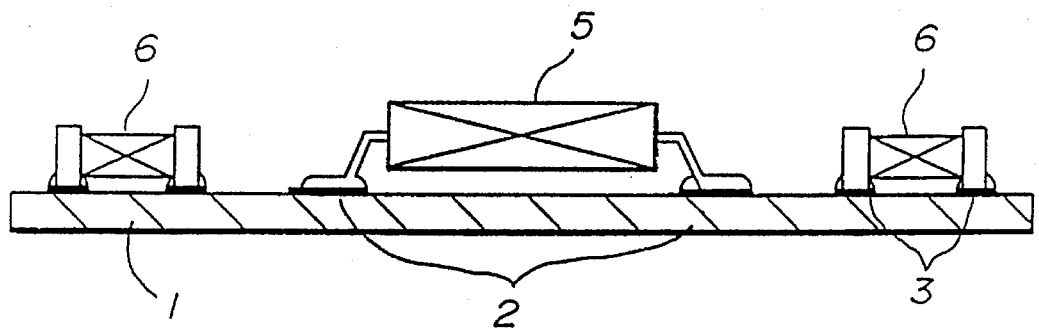
Figure 2A:
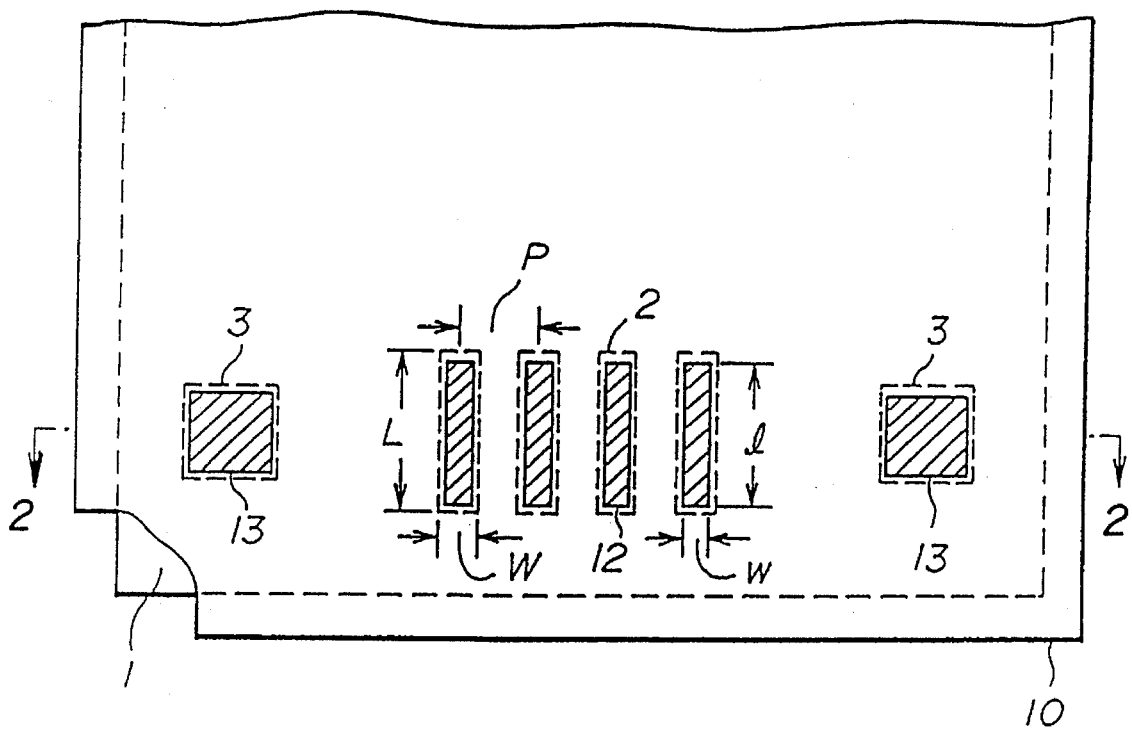
FIGS.2(A)–(B) are top and cross-sectional views, respectively, for explaining a conventional screen printing.
Figure 2B:
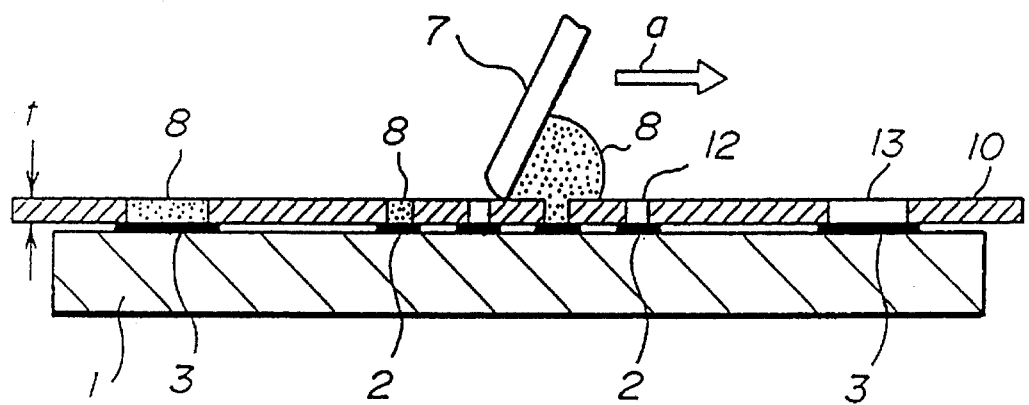
Figure 3:
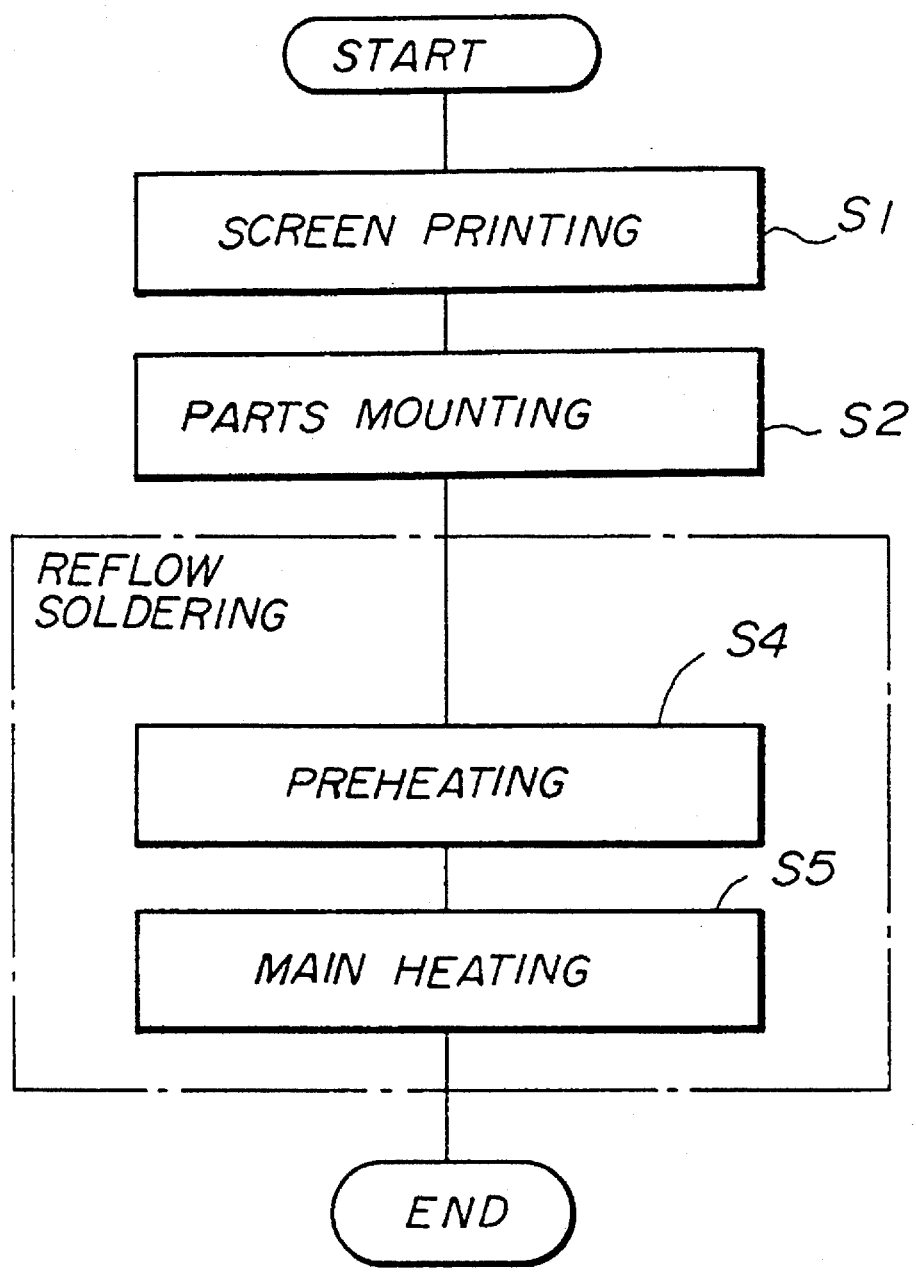
FIG.3 is a flow chart for explaining a conventional soldering method.
Figure 4A:
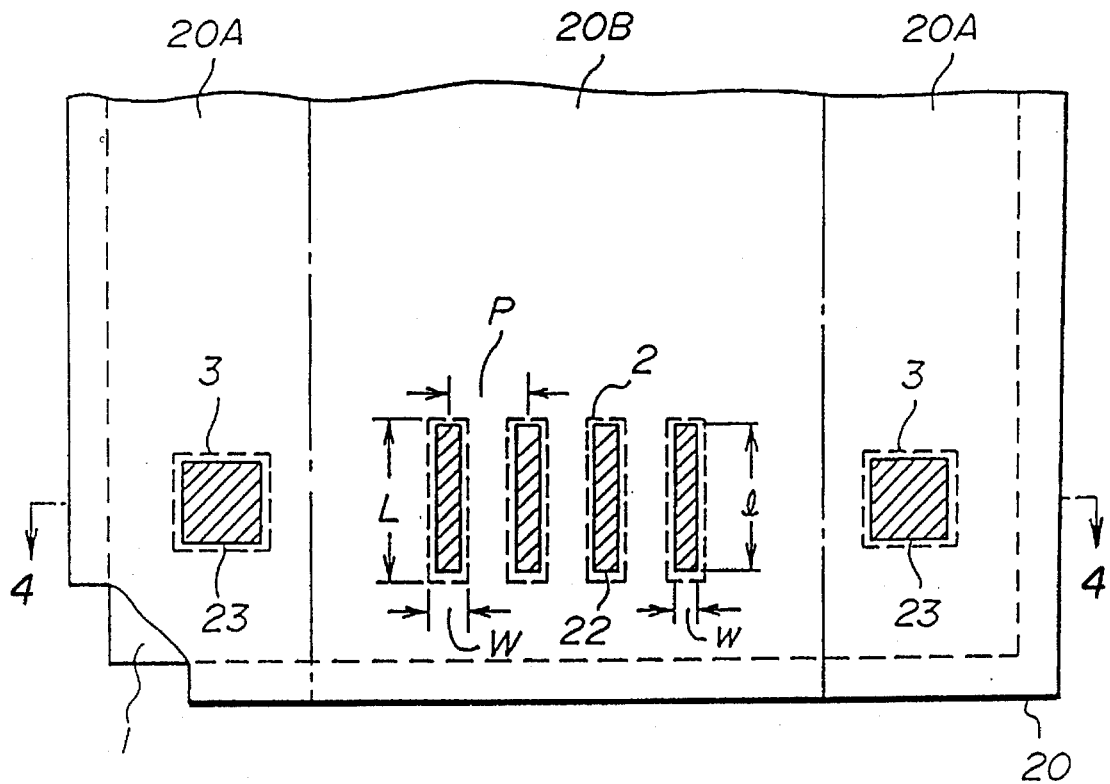
FIGS.4(A)–(B) are top and cross-sectional views, respectively, for explaining a first embodiment of the present invention.
Figure 4B:
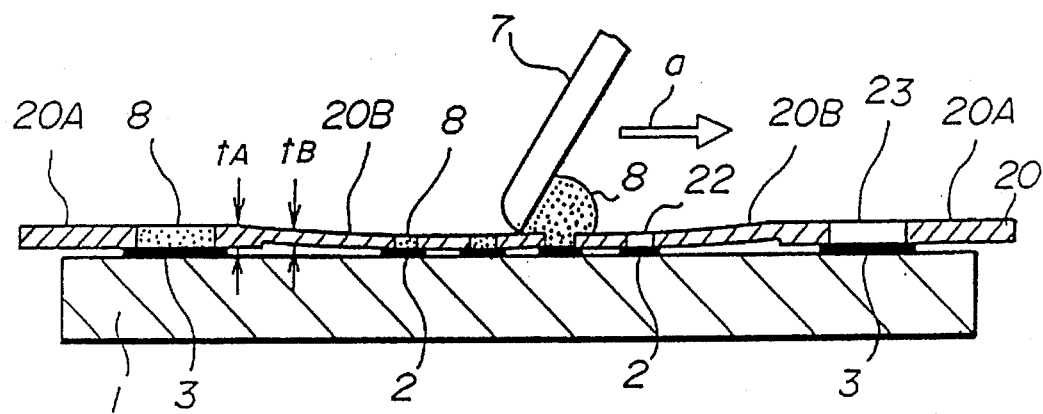

FIG. 4 is a diagram for explaining the first embodiment of the present invention. In FIG. 4, (A) shows a plan view, and (B) shows a cross section along a line 4—4 in (A). In FIG. 4, there are shown a circuit board 1, fine pads 2, normal pads 3, a squeegee 7, a solder paste 8, and a mask 20. This mask 20 has thick plate regions 20A and a thin plate region 20B. Fine mask holes 22 and normal mask holes 23 are formed in the mask 20.

The rectangular fine pads 2 have a length L=2 mm and a width W=150 μm, and are arranged at a pitch of 0.3 mm on the circuit board 1. The square normal pads 3 having a side of approximately 1.5 mm are arranged on the periphery of the fine pads 2.

On the other hand, the mask 20 is made of a stainless steel plate having a plate thickness $t_A$ of approximately 200 μm, for example, and the thin plate region 20B is formed by partially etching the plate to a thickness $t_B$ of approximately 100 μm. The fine mask holes 22 having approximately the same shape as the fine pads 2 are formed in the thin plate region 20B at positions aligned with each of the fine pads 2. In addition, the normal mask holes 23 having approximately the same shape as the normal pads 3 are formed in the thick plate region 20A at positions confronting each of the normal pads 3. The mask holes 22 and 23 are respectively formed by an etching process. Each mask aperture size (l, w) of the mask 20 is desirably selected to a shape which is reduced by several tens of μm compared to the foot print size (L, W). Hence, the aspect ratio ($w/t_B$) at the cross section of the fine mask hole 22 is 1 or greater in this embodiment, and the fine mask holes 22 can be etched with a high precision.

When aligning the mask 20 to the circuit board 1 and placing the mask 20 on the circuit board 1, the mask 20 is arranged so that the surface having the boundary between the thick plate region 20A and the thin plate region 20B on the same surface faces up. The solder paste 8 such as the solder paste on the market having cubic solder particles is coated on the entire surface of the mask 20. Then, the squeegee 7 which is mounted at an angle of 60° to a screen printer (not shown), for example, pushes against the surface of the mask 20 to make a contact printing. For example, the squeegee 7 is moved at a speed of 1 cm/sec to fill the solder paste 8 into the fine mask holes 22 and the normal mask holes 23. Thereafter, when the mask 20 is removed, a solder film having a film thickness of 100 μm is formed on each fine pad 2 and a solder film having a film thickness of 200 μm is formed on each normal pad 3. The film thicknesses of the solder films formed on the pads 2 and 3 are appropriate for carrying out the reflow soldering to mount the fine pitch parts and the normal pitch parts on the respective pads 2 and 3. In other words, optimum amounts of the solder paste 8 are respectively supplied to the pads 2 and 3.

The material used for the mask 20 is not limited to stainless steel. In addition, the mask holes of the mask 20 may be formed by a subtractive (etching) method or an additive (plating) method. According to the additive method, it is possible to form mask holes having a straight cross sectional shape and improve the solder paste printing.

Figure 5A:
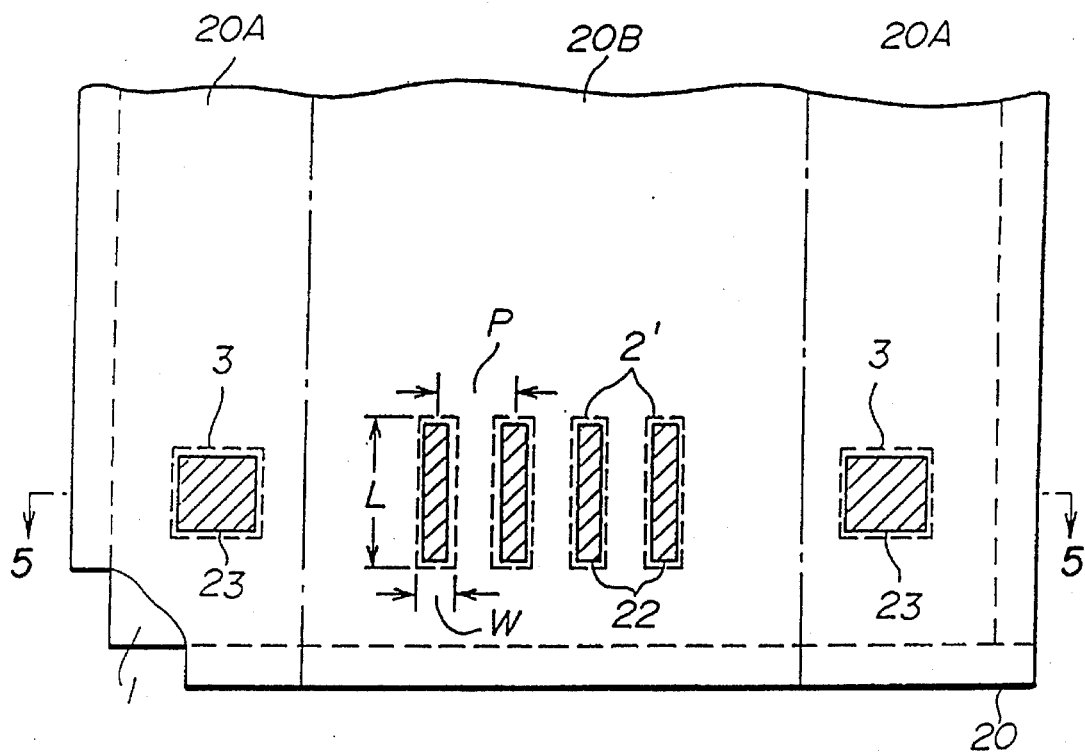
FIGS.5(A)–(B) are top and cross-sectional views, respectively for explaining a second embodiment of the present invention.
Figure 5B:
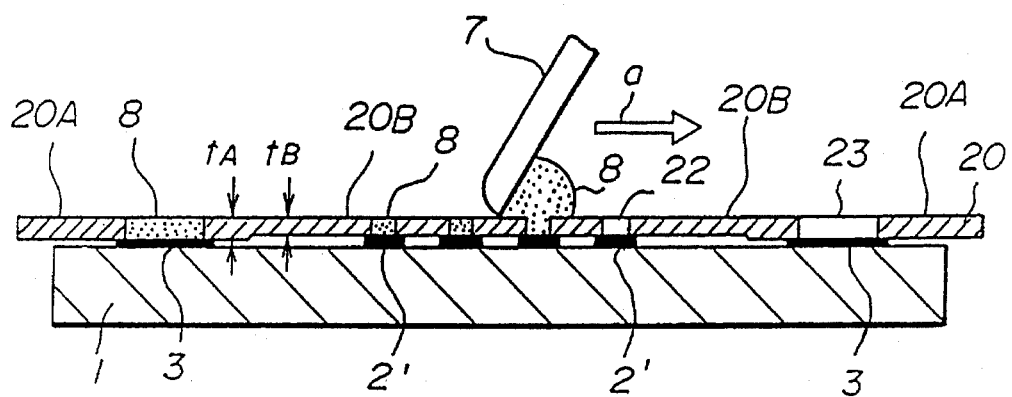

FIG. 5 is a diagram for explaining the second embodiment of the present invention. In FIG. 5, (A) shows a plan view, and (B) shows a cross section along a line 5—5 in (A). In FIG. 5, there are shown fine pads 2'.

In this embodiment, the film thickness of the fine pads 2' is thicker than the film thickness of the normal pads 3 by a predetermined value which is approximately 100 μm, for example. Similarly to the first embodiment shown in FIG. 4, the mask 20 having the plate thickness $t_A$ of approximately 200 μm and the plate thickness $t_B$ of approximately 100 μm is aligned to the circuit board 1 and placed thereon. Further, the solder paste 8 is coated on the mask 20 by the squeegee 7 so as to print the solder paste 8 on the circuit board 1. In this case, the boundary parts between the thick plate region 20A and the thin plate region 20B is maintained to the same height, and thus, the moving speed of the squeegee 7 and the pressure applied to the mask 20 become constant. As a result, the stress at the boundary part of the mask 20 is reduced and the serviceable life of the mask 20 is improved.

Figure 6A:
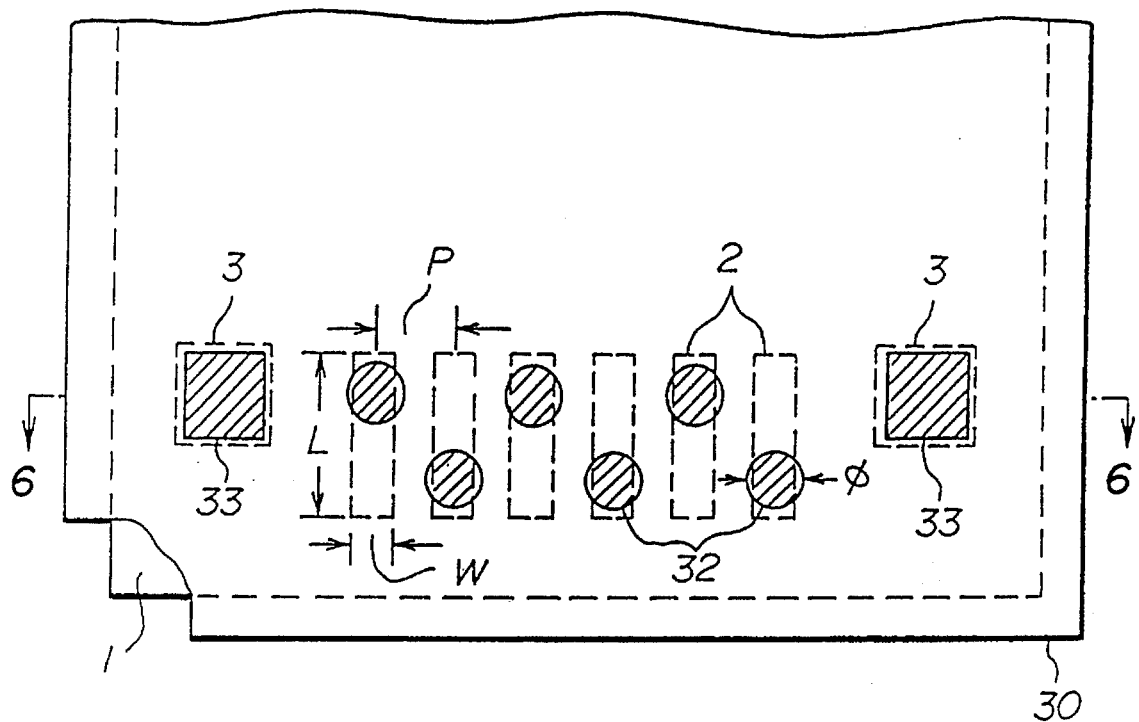
FIGS.6(A)–(B) are top and cross-sectional views, respectively for explaining a third embodiment of the present invention.
Figure 6B:
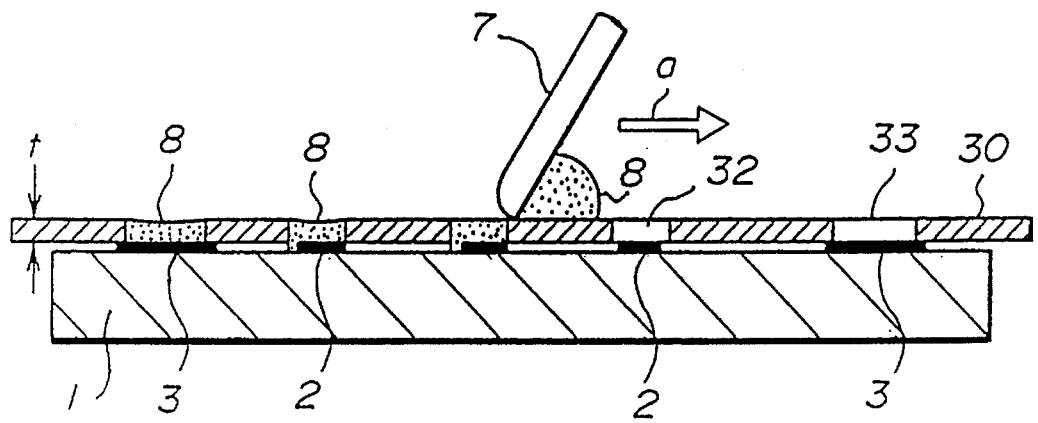

FIG. 6 is a diagram for explaining the third embodiment of the present invention. In FIG. 6, (A) shows a plan view, and (B) shows a cross section along a line 6—6 in (A). In FIG. 6, there is shown a mask 30 having fine mask holes 32 and normal mask holes 33.

The rectangular fine pads 2 having the length L=2 mm and the width W=150 μm are arranged at the pitch P=0.3 mm on the circuit board 1. The square normal pads 3 having a side of approximately 1.5 mm are arranged on the periphery of the fine pads 2.

The mask 30 is made of a stainless steel plate having a uniform thickness t of approximately 150 μm. The fine mask holes 32 having an approximately circular shape are formed in the mask 30 at positions confronting each of the fine pads 2. In addition, the normal mask holes 33 having approximately the same shape as the normal pads 3 are formed in the mask 30 at positions confronting each of the normal pads 3. The mask holes 32 and 33 are respectively formed by an etching process. Since the fine mask holes 32 have the approximately circular shape and the normal mask holes 33 have the approximately square shape, the printing characteristic of the solder paste 8 is completely independent of the moving direction of the squeegee 7.

The shape of the fine mask holes 32 is not limited to the circular shape, and the fine mask-holes 32 may have a triangular, square, trapezoidal, rhombic, or other polygonal shapes which would result in effects similar to those obtainable using the circular fine mask holes 32.

The diameter φ of the fine mask hole 32 is desirably greater than the width W of the rectangular fine pad 2 and smaller than the pitch P. Using another expression, it is desirable that the diameter φ of the fine mask hole 32 is less than the length L of the rectangular fine pad 2 and is greater than the width W by a predetermined amount, and further, that the aperture area of the fine mask hole 32 is smaller than the surface area (L×W) of the fine pad 2.

By appropriately selecting the aperture diameter φ of the fine mask hole 32 within the above described range, it becomes unnecessary to partially change the plate thickness t as in the case of the first and second embodiments shown in FIGS.4 and 5, and the aspect ratio (φ/t) of the fine mask hole 32 can easily be made greater than 1. Accordingly, the fine mask holes 32 can be formed accurately to the designed size. In addition, it is possible to easily control the amount of solder paste to be supplied by controlling the aperture diameter φ.

For example, if the aperture diameter φ of the fine mask hole 32 is selected to approximately 200 μm, this aperture diameter φ becomes greater than the width of the rectangular fine pad 2 which is 150 μm and is smaller than the pitch of the rectangular fine pads 2 which is 300 μm. In addition, the aspect ratio (φ/t) at the cross section of the fine mask hole 32 becomes (200 μm/150 μm) which is sufficiently greater than 1.

The mask 30 described above is aligned to the circuit board 1 and placed thereon, and the solder paste 8 having the cubic solder particles is coated on the entire surface of the mask 30. The squeegee 7 which is mounted at an angle of 60° to the screen printer, for example, pushes against the surface of the mask 30 to make a contact printing. This squeegee 7 is moved at a speed of 1 cm/sec, for example, and the solder paste 8 fills the fine mask holes 32 and the normal mask holes 33 of the mask 30. Thereafter, when the mask 30 is removed, solder films having a film thickness of 150 μm are respectively formed on the fine pads 2 and the normal pads 3.

Because the aperture diameter φ of the fine mask hole 32 is made greater than the width W of the fine pad 2, a part of the solder paste 8 is naturally forced out from the edge of the fine pad 2 along the transverse direction thereof at the time of the printing.

Therefore, as shown in FIG. 6, it is desirable to arrange the fine mask holes 32 in a checker-board (or zigzag) pattern with respect to the rectangular fine pads 2 which are linearly arranged on the circuit board 1, so that one fine mask hole 32 is provided with respect to each fine pad 2. By this checker-board arrangement, the distance between two adjacent printed solder films becomes sufficiently large, and there is no possibility of bridging. Moreover, the solder paste 8 which is forced out from the position of the fine pad 2 is attracted to the fine pad 2 when heated to carry out a reflow process under a nitrogen atmosphere because the fine pad 2 has a good wetting characteristic. In addition, the forced out solder paste 8 satisfactorily diffuses towards the large region along the longitudinal direction of the fine pad 2 where no solder paste is coated. As a result, the reflow solder is uniformly spread on the entire surface of the fine pad 2 by the reflow process.

In this case, although the aperture area of the fine mask holes 32 is small, the film thickness of the solder film formed by the solder paste 8 is approximately 150 μm and is sufficiently large. Hence, if this solder film is heated and subjected to the reflow process in the nitrogen atmosphere, the solder spreads on approximately the entire surface of the fine pad 2 which has an area at least two times the aperture area of the fine mask hole 32, and the film thickness of the reflow solder becomes an optimum thickness of approximately 100 μm.

Figure 7A:
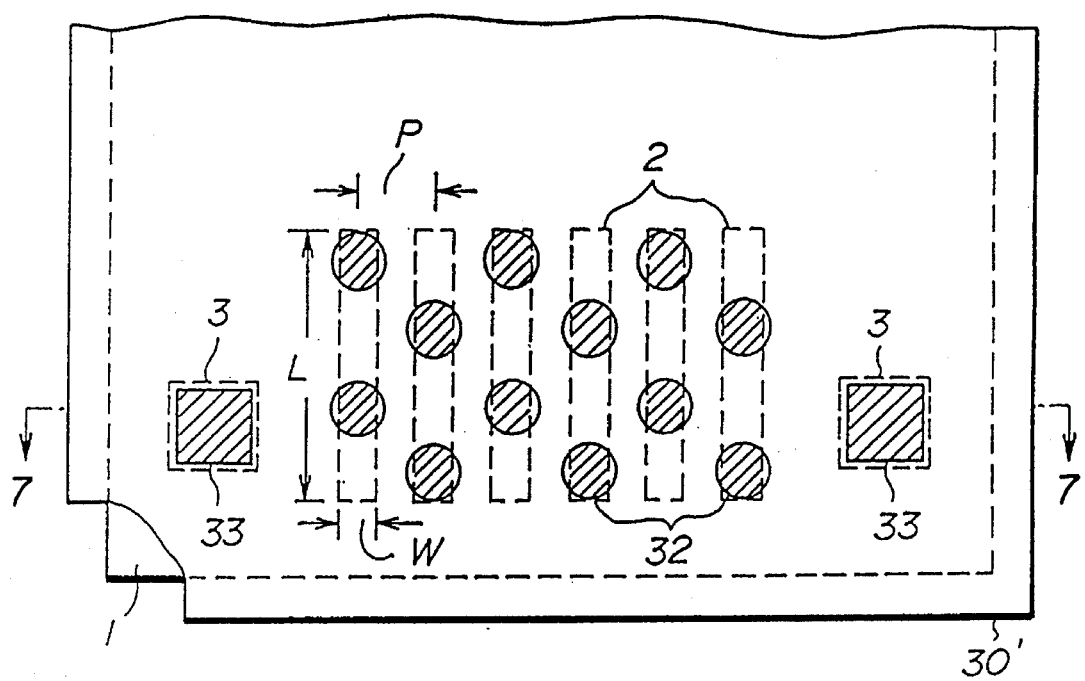
FIGS.7(A)–(B) are top and cross-sectional views, respectively for explaining a fourth embodiment of the present invention.
Figure 7B:
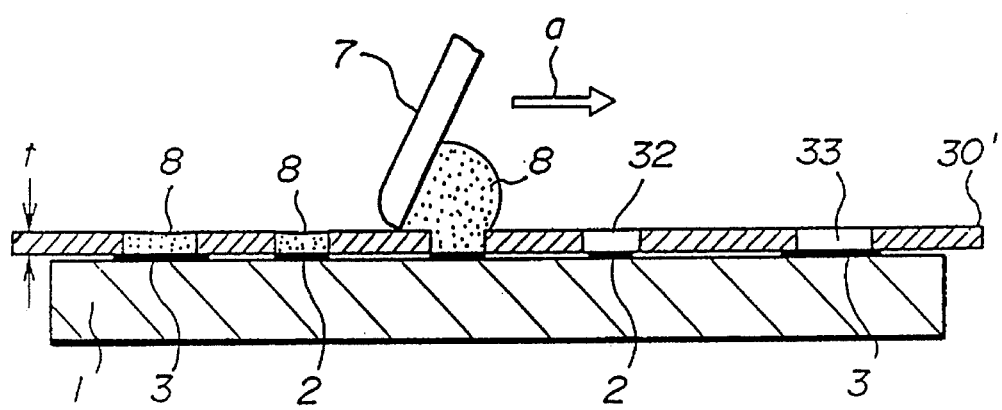

FIG. 7 is a diagram for explaining a fourth embodiment of the present invention. In FIG. 7, (A) shows a plan view, and (B) shows a cross section along a line 7—7 in (A).

If the length L of the fine pad 2 is long (for example, 3.5 mm) or if increasing the amount of the solder paste 8 to be supplied, the fine mask holes 32 may be arranged in a checker-board (or zigzag) pattern with respect to the rectangular fine pads 2 which are linearly arranged on the circuit board 1, so that two or more fine mask holes 32 are provided with respect to each fine pad 2 as shown in FIG. 7. By appropriately selecting the aperture diameter φ of the fine mask hole 32 or the number of the fine mask holes 32, it is possible to control the amount of the solder paste 8 which is supplied to obtain a desired value.

Figure 8A:
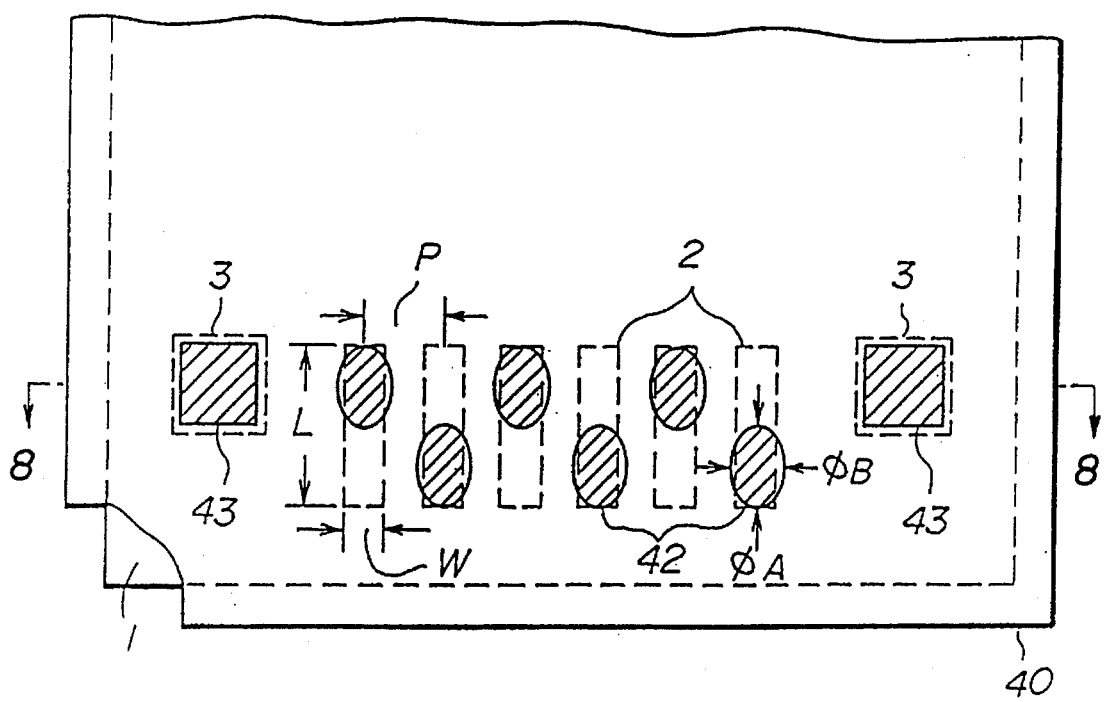
FIGS.8(A)–(B) are top and cross-sectional views, respectively for explaining a fifth embodiment of the present invention.
Figure 8B:
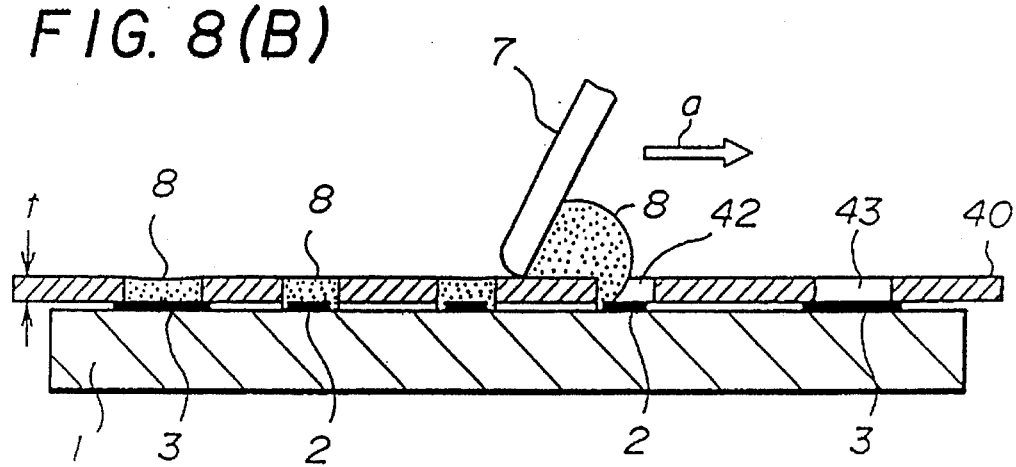

FIG. 8 is a diagram for explaining a fifth embodiment of the present invention. In FIG. 8, (A) shows a plan view, and (B) shows a cross section along a line 8—8 in (A). In FIG. 8, there are shown a mask 40 having fine mask holes 42 and normal mask holes 43.

The mask 40 is made of a stainless steel plate having a uniform plate thickness t of approximately 150 μm, for example. The approximately oval fine mask holes 42 are formed in the mask 40 at positions confronting each of the rectangular fine pads 2 on the circuit board 1, and the normal mask holes 43 having approximately the same shape as the normal pads 3 are formed in the mask 40 at positions confronting each of the normal pads 3. The mask holes 42 and 43 are respectively formed by an etching. Accordingly, the printing characteristic of the solder paste 8 is also virtually independent of the moving direction of the squeegee 7.

The shape of the fine mask holes 42 is not limited to the oval shape, and the fine mask holes 42 may have a rhombic, rectangular, trapezoidal, or other polygonal shapes which would result in effects similar to those obtainable using the oval fine mask holes 42.

The minor axis $\phi_B$ of the fine mask hole 42 is desirably greater than the width W of the rectangular fine pad 2 and smaller than the pitch P. Using another expression, it is desirable that the major axis $\phi_A$ of the fine mask hole 42 is smaller than the length L of the rectangular fine pad 2 and is greater than the width W by a predetermined amount, and further, that the aperture area of the fine mask hole 42 is smaller than the surface area (L×W) of the fine pad 2.

It is possible to change only the major axis $\phi_A$ of the fine mask hole 42 within the above described range while maintaining the minor axis $\phi_B$ to an optimum value. Hence, the aspect ratio ($\phi_B$/t) of the fine mask holes 42 can be made greater than 1, and the amount of solder paste 8 to be supplied can easily be increased by controlling the major axis $\phi_A$.

In this embodiment, the fine mask holes 42 are arranged in a checker-board (or zigzag) pattern with respect to the rectangular fine pads 2 which are linearly arranged on the circuit board 1, so that one fine mask hole 42 is provided with respect to each fine pad 2, similarly to the third embodiment shown in FIG. 6. By this checker-board arrangement, the distance between two adjacent printed solder films becomes sufficiently large, and there is no possibility of bridging. Moreover, the solder paste 8 which is forced out from the position of the fine pad 2 is attracted to the fine pad 2 when heated to carry out a reflow process in a nitrogen atmosphere because the fine pad 2 has a good wetting characteristic. In addition, the forced out solder paste 8 satisfactorily diffuses towards the large region along the longitudinal direction of the fine pad 2 where no solder paste is coated. As a result, the reflow solder is uniformly spread on the entire surface of the fine pad 2 by the reflow process.

Figure 9A:
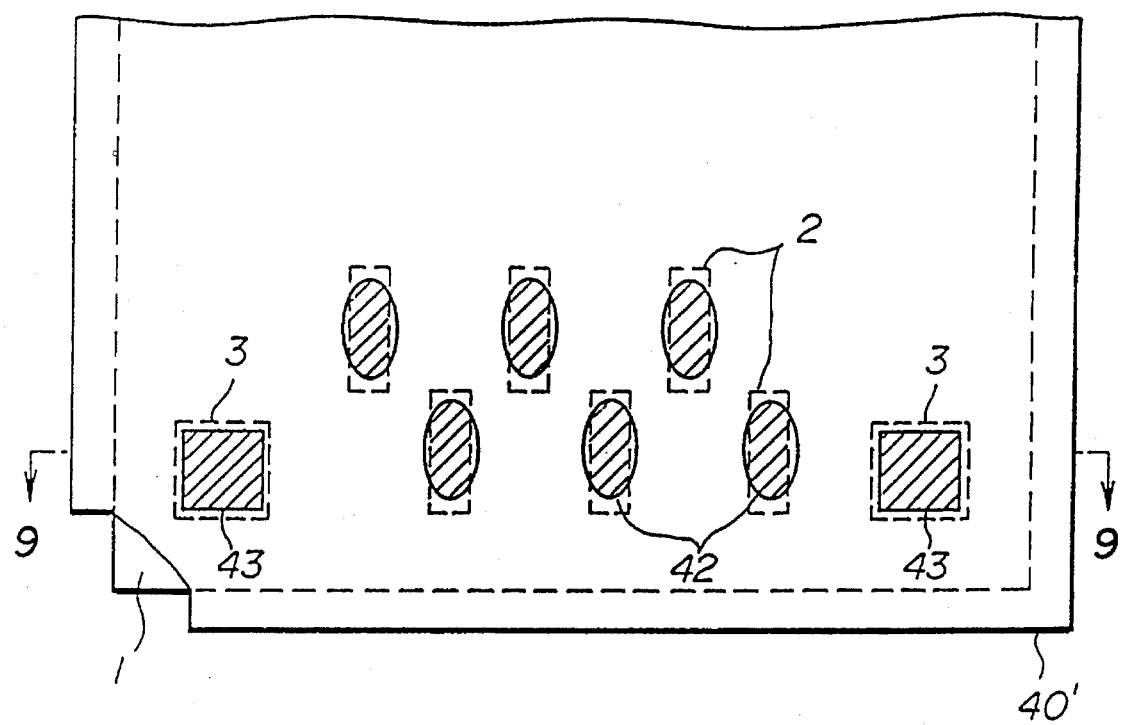
FIGS.9(A)–(B) are top and cross-sectional views, respectively for explaining a sixth embodiment of the present invention.
Figure 9B:
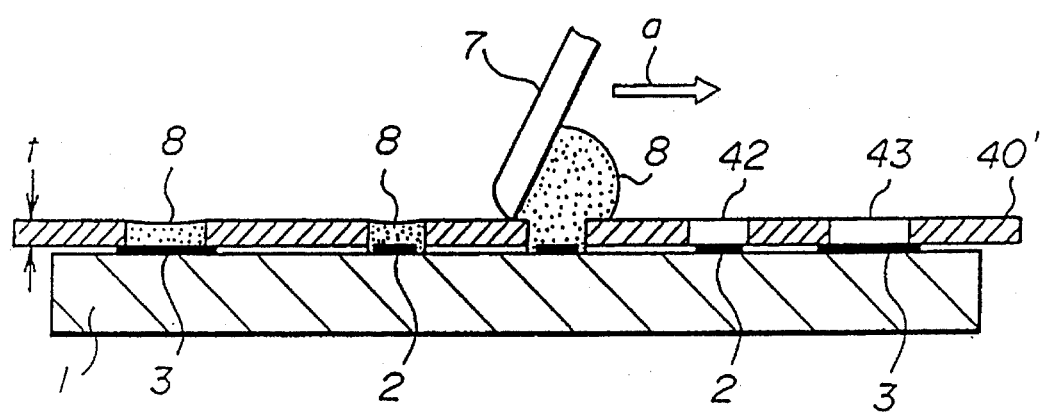

FIG. 9 is a diagram for explaining a sixth embodiment of the present invention. In FIG. 9, (A) shows a plan view, and (B) shows a cross section along a line 9—9 in (A). In FIG. 9, there is shown a mask 40'.

In this embodiment, the rectangular fine pads 2 have a length L=2 mm and a width W=150 μm, and the fine pads 2 are arranged at a pitch P=0.3 mm on the circuit board 1 in a checker-board (zigzag) arrangement. The square normal pads 3 having a side of approximately 1.5 mm are provided on the periphery of the fine pads 2.

The mask 40' is made of a stainless steel plate having a uniform plate thickness t of approximately 150 μm. The approximately oval fine mask holes 42 are formed in the mask 40' at positions confronting each of the rectangular fine pads 2 on the circuit board 1, and the normal mask holes 43 having approximately the same shape as the normal holes 3 are formed in the mask 40' at positions confronting each of the normal pads 3 on the circuit board 1. The mask holes 2 and 3 are respectively formed by an etching.

Figure 10:
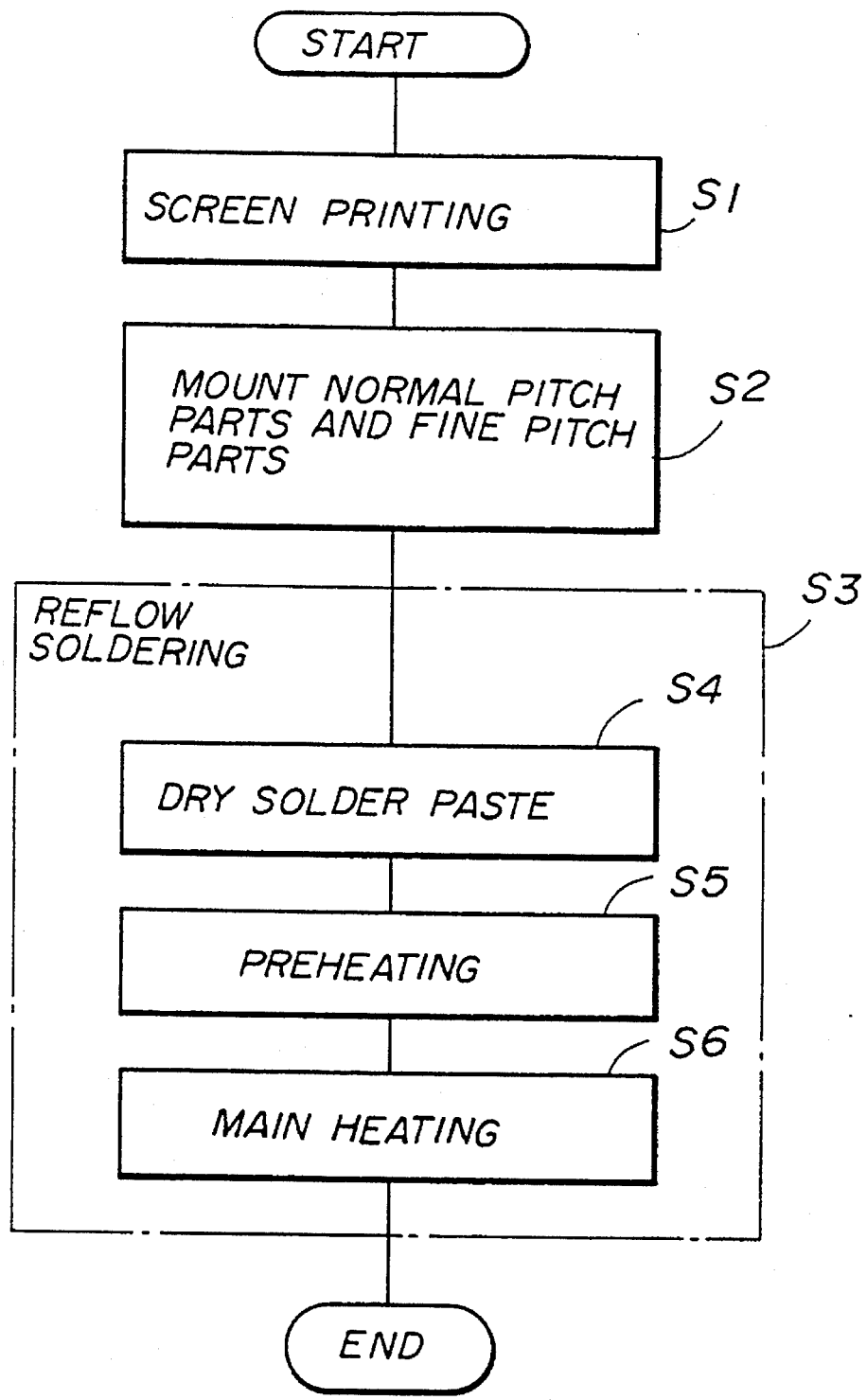
FIG.10 is a flow chart for explaining a seventh embodiment of the present invention.

FIG. 10 is a flow chart for explaining a seventh embodiment of the present invention.

A step S1 uses one of the masks 20, 30 and 40 of the above described embodiments, and carries out a screen printing to print the solder paste on the normal pads and the fine pads on the circuit board in one process. A step S2 mounts the normal pitch parts and the fine pitch parts on the respective pads, and a step S3 carries out a reflow soldering in a nitrogen atmosphere. In other words, a step S4 dries the solder paste at approximately 80° C. for 10 to 30 minutes, a step S5 carries out a preheating to a temperature of 120° to 160° C. for 20 to 30 seconds, and a step S6 carries out a main heating to a peak temperature of 230° C.

Therefore, by inserting a drying process in the nitrogen atmosphere prior to the reflow preheating, it is possible to evaporate the organic solvent within the solder paste and prevent premature melting of the solder paste. As a result, it is possible to prevent the formation of solder balls and bridges.

Figure 11:
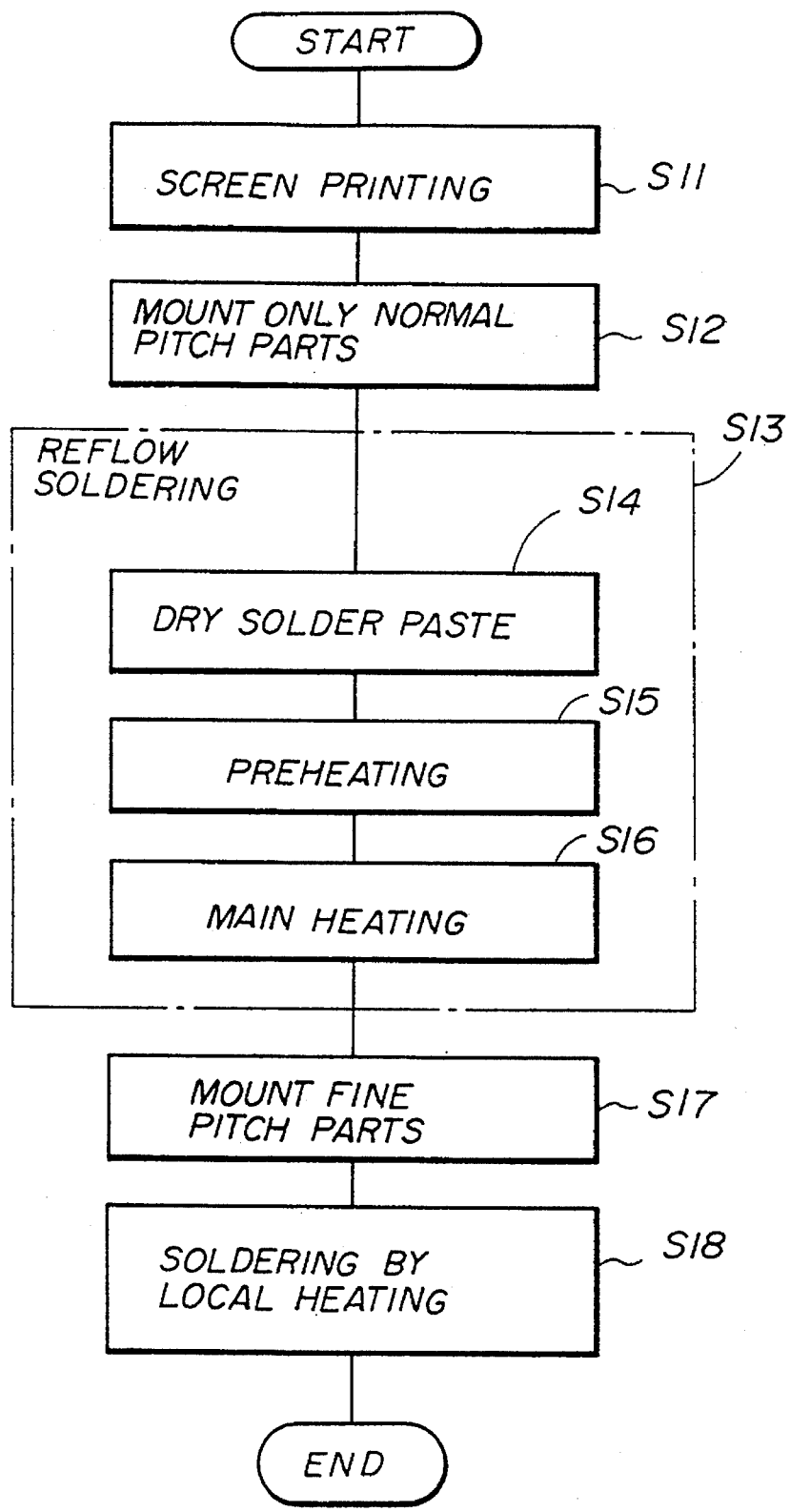
FIG. 11 is a flow chart for explaining an eighth embodiment of the present invention.

FIG. 11 is a flow chart for explaining an eighth embodiment of the present invention.

A step S11 uses one of the masks 20, 30 and 40 of the above described embodiments, and carries out a screen printing to print the solder paste on the normal pads and the fine pads on the circuit board in one process. A step S12 mounts only the normal pitch parts on the normal pads, and a step S13 carries out a reflow soldering under a nitrogen atmosphere. In other words, a step S14 dries the solder paste at approximately 80° C. for 10 to 30 minutes, a step S15 carries out a preheating to a temperature of 120° to 160° C. for 20 to 30 seconds, and a step S16 carries out a main heating to a peak temperature of 230° C.

As a result, the reflow soldering of the normal pitch parts is made, and the melted solder having a predetermined thickness is precoated on the fine pads. Since no parts are mounted on the fine pads, the heat capacity is small and the solder paste is satisfactorily spread on the entire surface of each fine pad.

Thereafter, a step S17 mounts the fine pitch parts on the fine pads, and a step S18 carries out a soldering using a local heating method which uses a soldering iron, for example. According to this embodiment, the soldering of the fine pitch parts can be made with an extremely high reliability.

In the described embodiments, the masks 20, 30 and 40 are made of a metal. However, the mask may be made of a material other than metal.

In addition, the fine pads 2 in the described embodiments have the rectangular (box) shape, but the shape of the fine pads 2 is not limited to such. In the case where the shape of the fine pads is not rectangular in the plan view, the length, width, pitch, arrangement and the like of the fine pads on the circuit board can be approximately selected depending on the needs.

Further, the present invention is not limited to these embodiments, but various variations and modifications may be made without departing from the scope of the present invention.

What is claimed is:

1. A mask for printing solder paste comprising:

a mask plate defined by top and bottom surfaces having first mask holes formed therein in a first surface region having a first thickness and second mask holes formed therein in a second surface region having a second thickness, the second thickness being less than the first thickness said first mask holes having a first uniform cross-sectional shape extending throughout a depth of the first mask holes from said top surface to said bottom surface of said first surface region, said second mask holes having a second uniform cross-sectional shape extending throughout a depth of the second mask holes from said top surface to said bottom surface of said second surface region, the area of the second cross-sectional shape being smaller than the area of the first cross-sectional shape, wherein said first mask holes and said second mask holes are formed entirely separately from each other such that none of said first mask holes and second mask holes overlap.

2. The mask as claimed in claim 1, wherein:

each of the second mask holes has a width in a direction in which a squeegee slides on the mask plate; and an aspect ratio of the width to the second thickness is larger than 1.

3. The mask as claimed in claim 1, wherein said second mask holes have rectangular shapes.

4. The mask as claimed in claim 1, wherein each of the second mask holes has a length larger than the width.

5. The mask as claimed in claim 1, wherein the mask plate is a stainless steel plate.

6. The mask as claimed in claim 1, wherein the first mask holes have square shapes.

7. A mask for printing solder paste comprising:

a mask plate having a uniform thickness defined by flat, non-stepped top and bottom surfaces, said mask plate having first and second mask holes formed therein, said first mask holes having a first uniform cross-sectional shape extending throughout a depth of the first mask holes from said top surface to said bottom surface, and second mask holes having a second uniform cylindrical cross-sectional shape extending throughout a depth of the second mask holes from said top surface to said bottom surface, the area of the second cross-sectional shape being smaller than the area of the first cross-sectional shape, wherein said first mask holes and said second mask holes are formed entirely separately from each other such that none of said first and second mask holes overlap.

8. The mask as claimed in claim 7 wherein the second mask holes are arranged so that a zigzag pattern of the second mask holes is formed.

9. The mask as claimed in claim 7 wherein the first mask holes have a square shape.

10. The mask as claimed in claim 7 wherein the mask plate is a stainless steel plate.

11. A mask for printing solder paste comprising:

said first mask holes having a first uniform cross-sectional shape extending throughout a depth of the first mask holes from said top surface to said bottom surface; and second mask holes having a second uniform cross-sectional shape extending throughout a depth of the second mask holes from said top surface to said bottom surface, wherein the area of the second cross-sectional shape is smaller than the area of the first cross-sectional shape, wherein said first mask holes and said second mask holes are formed entirely separately from each other such that none of said first and second mask holes overlap, and wherein the second mask holes have a diameter which is larger than a width of pads lying under the second mask holes in a printing process and which is smaller than a pitch between two adjacent pads.

12. A mask for printing solder paste comprising:

said first mask holes having a first uniform cross-sectional shape extending throughout a depth of the first mask holes from said top surface to said bottom surface; and second mask holes having a second uniform cross-sectional shape extending throughout a depth of the second mask holes from said top surface to said bottom surface, wherein the area of the second cross-sectional shape being smaller than the area of the first cross-sectional shape, wherein said first mask holes and said second mask holes are formed entirely separately from each other such that none of said first and second mask holes overlap and, wherein the second mask holes have an oval shape and a minor axis of the second mask holes is larger than a width of pads lying under the second mask hole in a printing process and is smaller than a pitch between adjacent two of the second mask holes.

* * * * *